(12) United States Patent
Refai-Ahmed et al.

(10) Patent No.: US 11,769,710 B2
(45) Date of Patent: Sep. 26, 2023

(54) HETEROGENEOUS INTEGRATION MODULE COMPRISING THERMAL MANAGEMENT APPARATUS

(71) Applicant: XILINX, INC., San Jose, CA (US)

(72) Inventors: Gamal Refai-Ahmed, Santa Clara, CA (US); Suresh Ramalingam, Fremont, CA (US); Ken Chang, Los Altos Hills, CA (US); Mayank Raj, Sunnyvale, CA (US); Chuan Xie, Fremont, CA (US); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 208 days.

(21) Appl. No.: 16/833,034

(22) Filed: Mar. 27, 2020

(65) Prior Publication Data
US 2021/0305127 A1 Sep. 30, 2021

(51) Int. Cl.
| | |
|---|---|
| *H01L 23/473* | (2006.01) |
| *H01L 25/16* | (2023.01) |
| *H01L 23/367* | (2006.01) |
| *H01L 23/40* | (2006.01) |

(52) U.S. Cl.
CPC ........ *H01L 23/473* (2013.01); *H01L 23/3675* (2013.01); *H01L 25/167* (2013.01); *H01L 2023/4062* (2013.01)

(58) Field of Classification Search
None
See application file for complete search history.

(56) References Cited

U.S. PATENT DOCUMENTS

| | | | | |
|---|---|---|---|---|
| 3,972,012 A | * | 7/1976 | Liu ................. | H01P 1/005 257/719 |
| 4,246,597 A | * | 1/1981 | Cole ................. | H01L 23/40 257/713 |

(Continued)

FOREIGN PATENT DOCUMENTS

EP  0014249 B1 * 6/1982 ......... H01L 23/3672

OTHER PUBLICATIONS

Refai-Ahmed, Gamal, et al., Extending the Performance of High Heat Flux 2.5D and 3D Packaging from Component-system Interaction, 19th International Conference on Thermal, Mechanical and Multi-Physics Simulation and Experiencement in Microelectronics and Microsystems (EuroSimE), 2018. (6 pages).

*Primary Examiner* — Evren Seven
(74) *Attorney, Agent, or Firm* — Patterson + Sheridan, LLP

(57) ABSTRACT

Some examples described herein provide for a heterogeneous integration module (HIM) that includes a thermal management apparatus. In an example, an apparatus (e.g., a HIM) includes a wiring substrate, a first component, a second component, and a thermal management apparatus. The first component and the second component are communicatively coupled together via the wiring substrate. The thermal management apparatus is in thermal communication with the first component and the second component. The thermal management apparatus has a first thermal energy flow path for dissipating thermal energy generated by the first component and has a second thermal energy flow path for dissipating thermal energy generated by the second component. The first thermal energy flow path has a lower thermal resistivity than the second thermal energy flow path.

20 Claims, 5 Drawing Sheets

(56) References Cited

U.S. PATENT DOCUMENTS

| | | | | |
|---|---|---|---|---|
| 4,381,032 A * | 4/1983 | Cutchaw | H01L 23/4338 | 361/689 |
| 4,639,829 A * | 1/1987 | Ostergren | H01L 23/4006 | 257/713 |
| 4,928,207 A * | 5/1990 | Chrysler | H01L 23/427 | 257/E23.093 |
| 5,001,548 A | 3/1991 | Iversen | | |
| 5,005,638 A * | 4/1991 | Goth | H01L 23/4338 | 165/185 |
| 5,126,829 A * | 6/1992 | Daikoku | H01L 23/4338 | 257/713 |
| 5,162,974 A * | 11/1992 | Currie | H05K 7/20 | 257/688 |
| 5,168,919 A * | 12/1992 | Berenholz | F28D 15/0233 | 165/185 |
| 5,388,635 A * | 2/1995 | Gruber | F28F 3/12 | 257/E23.09 |
| 5,862,038 A * | 1/1999 | Suzuki | H01L 23/4006 | 361/709 |
| 5,886,408 A * | 3/1999 | Ohki | H01L 23/3675 | 257/796 |
| 6,275,381 B1 * | 8/2001 | Edwards | H05K 7/20454 | 257/713 |
| 6,580,611 B1 * | 6/2003 | Vandentop | H01L 23/367 | 257/713 |
| 6,611,431 B1 * | 8/2003 | Lee | H01L 23/4006 | 257/E23.084 |
| 6,656,770 B2 * | 12/2003 | Atwood | H01L 23/4275 | 257/713 |
| 6,665,187 B1 * | 12/2003 | Alcoe | H01L 23/427 | 257/E23.101 |
| 7,031,162 B2 * | 4/2006 | Arvelo | H01L 24/31 | 257/713 |
| 7,944,046 B2 * | 5/2011 | Chao | H01L 25/0655 | 257/713 |
| 7,990,711 B1 * | 8/2011 | Andry | H01L 25/0657 | 165/80.4 |
| 8,378,322 B2 | 2/2013 | Dahm et al. | | |
| 8,558,372 B2 * | 10/2013 | Negoro | H01L 23/42 | 257/706 |
| 8,564,957 B2 * | 10/2013 | Usui | H05K 7/20509 | 361/720 |
| 9,076,754 B2 * | 7/2015 | Hung | H01L 25/0657 | |
| 9,165,857 B2 * | 10/2015 | Song | H01L 23/473 | |
| 9,583,415 B2 * | 2/2017 | Yu | H01L 23/3675 | |
| 9,812,374 B1 | 11/2017 | Refai-Ahmed et al. | | |
| 9,941,251 B2 * | 4/2018 | Hung | H01L 23/3672 | |
| 10,685,904 B2 * | 6/2020 | Tsai | H01L 23/4334 | |
| 2005/0068739 A1 * | 3/2005 | Arvelo | H01L 23/3675 | 257/E23.09 |
| 2009/0284921 A1 | 11/2009 | Colgan et al. | | |
| 2010/0181665 A1 | 7/2010 | Casey et al. | | |
| 2010/0275971 A1 | 11/2010 | Zingher | | |
| 2015/0035134 A1 | 2/2015 | Hung et al. | | |
| 2015/0108628 A1 * | 4/2015 | Yu | H01L 23/3675 | 257/712 |
| 2015/0162307 A1 * | 6/2015 | Chen | H01L 23/367 | 438/107 |
| 2016/0284624 A1 * | 9/2016 | Yamada | H01L 23/4338 | |
| 2017/0186665 A1 | 6/2017 | Choudhury et al. | | |
| 2017/0359920 A1 * | 12/2017 | Huang | H01L 23/34 | |
| 2018/0061731 A1 | 3/2018 | Val | | |

* cited by examiner

HETEROGENEOUS INTEGRATION MODULE COMPRISING THERMAL MANAGEMENT APPARATUS

This invention was made with U.S. Government support under Agreement No. HR0011-19-3-0004, awarded by Defense Advanced Research Projects Agency. The U.S. Government has certain rights in the invention.

TECHNICAL FIELD

Examples of the present disclosure generally relate to a heterogeneous integration module comprising a thermal management apparatus.

BACKGROUND

Electronic devices, such as are included in tablets, computers, copiers, digital cameras, smart phones, control systems, and automated teller machines, among others, often include integrated circuit die(s) for some desired functionality. Dies can consume various amounts of electrical power. By consuming electrical power, dies can generate thermal energy. The thermal energy can accumulate in the die if the thermal energy is not dissipated by the transfer of thermal energy. If thermal energy accumulates to too great of levels, and the die becomes too hot, deleterious effects may occur. For example, physical characteristics of devices in the die may be altered by excessive temperatures. As an example, threshold voltages of transistors in the die can vary as temperature changes. Further, migration of metal in the die can be increased by increased thermal energy. Accordingly, thermal management of electronic devices that include a die is a concern.

SUMMARY

Some examples described herein provide for a heterogeneous integration module (HIM) that includes a thermal management apparatus. In such a HIM, components having different specifications for operating temperatures can be incorporated in close proximity to avoid significant delay of signal propagation between the components and degradation of signals propagated between the components. Additionally, the components can be operated at their respective rated temperatures.

An example of the present disclosure is an apparatus. The apparatus includes a wiring substrate, a first component, a second component, and a thermal management apparatus. The first component and the second component are communicatively coupled together via the wiring substrate. The thermal management apparatus is in thermal communication with the first component and the second component. The thermal management apparatus has a first thermal energy flow path for dissipating thermal energy generated by the first component and has a second thermal energy flow path for dissipating thermal energy generated by the second component. The first thermal energy flow path has a lower thermal resistivity than the second thermal energy flow path.

Another example of the present disclosure is a system. The system includes a heterogeneous integration module. The heterogeneous integration module includes a wiring substrate, a first component attached to the wiring substrate, a second component attached to the wiring substrate, a first thermal interface material disposed on the first component, a second thermal interface material disposed on the second component, and a thermal management apparatus. The first component and the second component are communicatively coupled together through the wiring substrate. The thermal management apparatus contacts the first thermal interface material and the second thermal interface material. The thermal management apparatus has a first thermal energy flow path from where the thermal management apparatus contacts the first thermal interface material and has a second thermal energy flow path from where the thermal management apparatus contacts the second thermal interface material. The first thermal energy flow path has a lower thermal resistivity than the second thermal energy flow path.

A further example of the present disclosure is a method for forming a heterogeneous integration module. A first component and a second component are assembled on a wiring substrate. A thermal management apparatus is secured in thermal communication with the first component and the second component. The thermal management apparatus has a first thermal energy flow path for thermal energy generated by the first component and has a second thermal energy flow path for thermal energy generated by the second component. The first thermal energy flow path has a lower thermal resistivity than the second thermal energy flow path.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
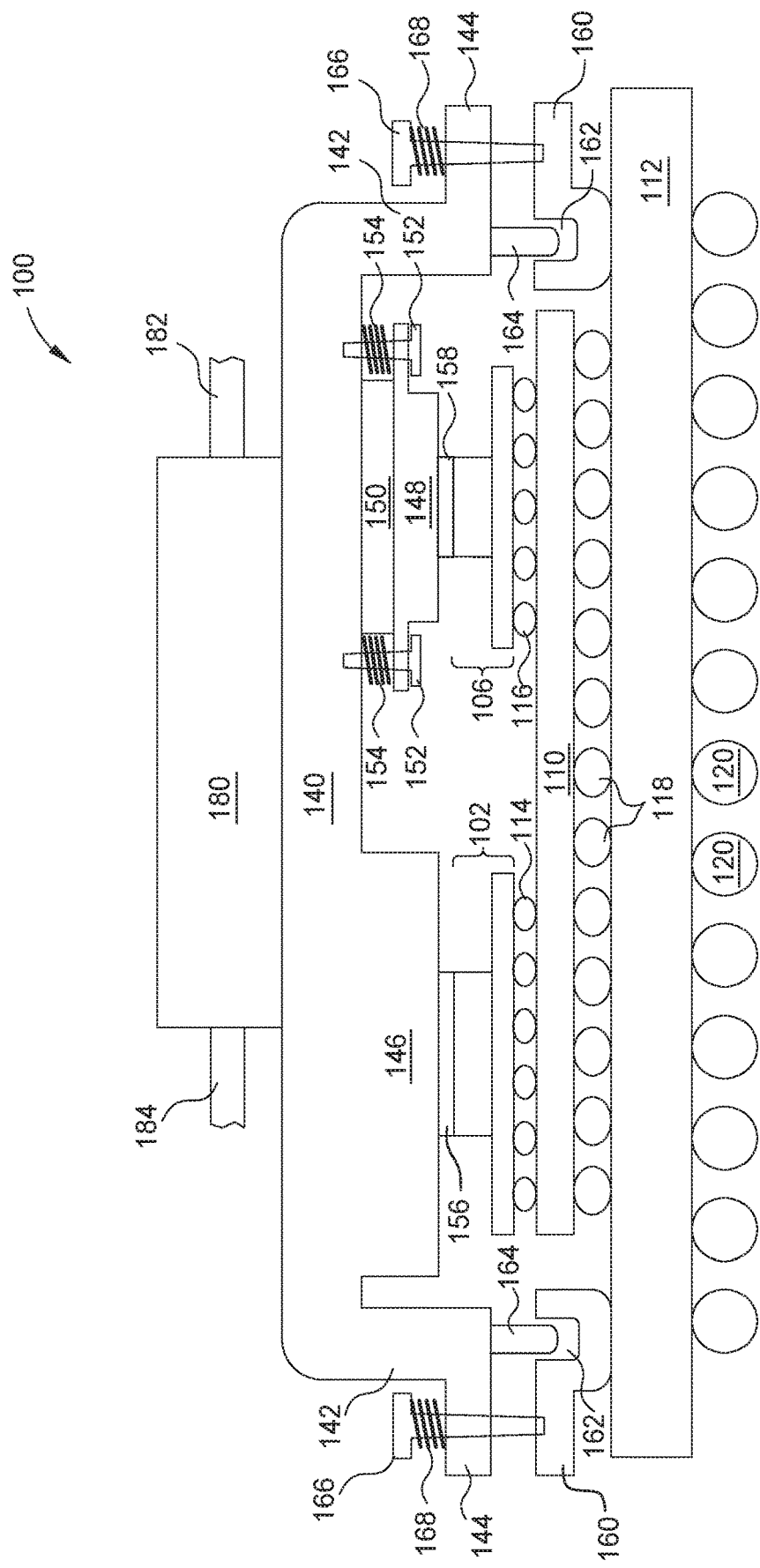
FIG. 1 depicts a simplified cross-sectional view of a first heterogeneous integration module (HIM) comprising a thermal management apparatus according to some examples.

Some examples described herein provide for a heterogeneous integration module (HIM) that includes a thermal management apparatus. The HIM includes a first component and a second component attached to a wiring substrate. The first component and the second component are communicatively coupled together through the wiring substrate. The first component and the second component can have respective specifications for operating temperatures that differ. For example, the first component can have a target operating temperature that is lower than the target operating temperature of the second component. In some examples, the first component can be an active optical and/or photonic device, and the second component can be an active electrical device (e.g., a die having a processor, a programmable logic integrated circuit (IC), an application specific IC (ASIC), the like, or a combination thereof). The thermal management apparatus is in thermal communication with the first component and the second component to dissipate thermal energy generated by the first component and the second component. A thermal energy flow path through the thermal management apparatus for dissipating thermal energy generated by the first component can have a thermal resistance that is less than a thermal energy flow path through the thermal management apparatus for dissipating thermal energy generated by the second component. In such a HIM, components having different specifications for operating temperatures can be incorporated in close proximity to avoid significant delay of signal propagation between the components and to avoid degradation of signals propagated between the components. Additionally, the components can be operated at their respective rated temperatures. A HIM, as described herein, may be particularly useful for computing and/or networking devices (e.g., fiber optic devices).

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 illustrates a simplified cross-sectional view of a first HIM 100 comprising a thermal management apparatus according to some examples. The first HIM 100 includes a first component 102 and a second component 106. The first component 102 generally has a specification for an operating temperature that is lower than a specification for an operating temperature of the second component 106. For example, the first component 102 can be or include an active optical and/or photonic device (e.g., for generating an optical signal for a fiber optic port), and the second component 106 can be or include an electrical device (e.g., a die comprising a processor, a programmable logic IC, an ASIC, the like, or a combination thereof), where the optical and/or photonic device has a lower operating temperature than the electrical device. The thermal management apparatus of the first HIM 100, as described below, assists controlling the operating temperatures of the first component 102 and the second component 106 to be within the respective specifications.

The first HIM 100 includes an interposer 110 and a package substrate 112. The first component 102 is attached to a first side of the interposer 110 by external connectors 114, and the second component 106 is attached to the first side of the interposer 110 by external connectors 116. The external connectors 114, 116 can be, for example, microbumps or the like, and can form an electrical connection and physical attachment between the first component 102 and the interposer 110 and between the second component 106 and the interposer 110, respectively. A second side of the interposer 110 (opposite from the first side of the interposer 110) is attached to a first side of the package substrate 112 by external connectors 118. The external connectors 118 can be, for example, controlled collapse chip connections (C4) or the like, and can form an electrical connection and physical attachment between the interposer 110 and the package substrate 112. External connectors 120 are attached to a second side of the package substrate 112 (opposite from the first side of the package substrate 112). The external connectors 120 can be, for example, ball grid array (BGA) balls or the like, and may be used to attach the package substrate 112 to a printed circuit board (PCB) (not shown).

The arrangement of first component 102, second component 106, interposer 110, and package substrate 112 is for illustration purposes. The HIM can have different configurations with more or fewer components. For example, the first component 102 and second component 106 can be attached to the package substrate 112 by external connectors without an interposer intervening therebetween. In other examples, the first component 102 and second component 106 can be integrated in an integrated fan-out package. The first component 102 and second component 106 are electrically and/or communicatively coupled together via the interposer 110 in the illustrated example, or via an interposer, package substrate, and/or metalization of an integrated fan-out package. Generically, the first component 102 and second component 106 are electrically and/or communicatively coupled together via a wiring substrate. In some examples, the first component 102 and second component 106 are in closer proximity compared with prior techniques that did not integrate similar components in a HIM, and hence, delay of signal propagation and signal degradation due to wiring lengths connecting the first component 102 and second component 106 can be reduced.

The thermal management apparatus of the first HIM 100 includes a main portion 140, a vertical support portion 142, and a flange portion 144. The main portion 140 is generally horizontal and overlies, and is in thermal communication with, the first component 102 and the second component 106. The vertical support portion 142 extends vertically downward (e.g., toward the package substrate 112) perpendicular to and from a periphery of, and around, the main portion 140. The flange portion 144 extends horizontally away from and perpendicular to a lower portion of the vertical support portion 142 proximate the package substrate 112.

The main portion 140 of the thermal management apparatus has an integral island portion 146. The integral island portion extends vertically downward (e.g., in a same direction that the vertical support portion 142 extends) from a bottom side of the main portion 140 and at a location corresponding to the first component 102. A separate island 148 is mechanically coupled to the bottom side of the main portion 140 and at a location corresponding to the second component 106. A first thermal interface material (TIM) 150 is disposed between and contacting the main portion 140 and the separate island 148. Screws 152 are inserted through the separate island 148 at respective periphery locations, are inserted through respective springs 154, and are threadedly engaged with (e.g., screwed into) the bottom side of the main portion 140. The separate island 148 may float along the length of the screws 152. The springs 154 apply a downward force on the separate island 148 (e.g., in a direction away from the bottom side of the main portion 140). A counter force may be applied to the separate island 148 (e.g., in part by the first component 102, as will be described subsequently). Depending on the magnitude of these forces, the separate island 148 may be at any of various positions along the lengths of the screws 152.

A second TIM 156 is on a backside of the first component 102, and a third TIM 158 is on a backside of the second component 106. The integral island portion 146 contacts the second TIM 156, and hence, the thermal management apparatus is in thermal communication with the first component 102. The separate island 148 contacts the third TIM 158, and hence, the thermal management apparatus is in thermal communication with the second component 106.

The thermal management apparatus is mechanically coupled to the package substrate 112. The thermal management apparatus can be mechanically coupled to the package substrate in numerous ways. In the illustrated example, a stiffener 160 (e.g., a ring stiffener) is adhered, e.g., by an epoxy, to the package substrate 112. The stiffener 160 has blind holes 162. The thermal management apparatus has guide pins 164 extending vertically downward from the vertical support portion 142. The guide pins 164 align with and are inserted into the blind holes 162. The insertion of the guide pins 164 into the blind holes 162 can align the thermal management apparatus with the stiffener 160, and further, can align the thermal management apparatus to the first component 102 and second component 106. Screws 166 are inserted through respective springs 168, through the flange portion 144, and are threadedly engaged with (e.g., screwed into) the stiffener 160. The flange portion 144 (and hence, the thermal management apparatus) may float along the length of the screws 166. The springs 168 apply a downward force on the flange portion 144. A counter force may be applied to the main portion 140 (e.g., in part by the first component 102). Depending on the magnitude of these forces, the flange portion 144 may be at any of various positions along the lengths of the screws 166.

A person having ordinary skill in the art will readily understand that the components of the first HIM 100 may be manufactured with various tolerances and/or warpage (e.g., due to thermal cycling). The configuration of screws and springs as described above permits the thermal management apparatus to be securely affixed in the first HIM 100 without generating additional stresses in the first HIM 100. For example, the thermal management apparatus can be held securely in a position where the integral island portion 146 contacts the second TIM 156 by the force of the springs 168 forcing the flange portion 144 (and hence, the main portion 140 and integral island portion 146) downward. Without the springs 168, there may be a risk that the screws 166 would be over-torqued, which could cause additional and deleterious stress in the first HIM 100, or under-torqued, which could permit the integral island portion 146 from contacting the second TIM 156. Additionally, in this example with the position of the thermal management apparatus largely being determined by the first component 102, the screws 152 and springs 154 can accommodate any further tolerances such that the separate island 148 can still contact the third TIM 158. Before the thermal management apparatus is placed on and secured to the stiffener 160, the first TIM 150 may fill a maximum space between the bottom of the main portion 140 and the separate island 148, and when the separate island 148 contacts the third TIM 158, the first TIM 150 may be compressed and extrude out from between the main portion 140 and the separate island 148.

In the illustrated example, the thermal management apparatus is mechanically coupled to the package substrate 112 (e.g., via the stiffener 160). In other examples, the thermal management apparatus can be mechanically coupled to another component instead of the package substrate. For example, the vertical support portion 142 of the thermal management apparatus can be around a package substrate, and the thermal management apparatus may be mechanically coupled to a PCB. The stiffener 160 can be adhered or soldered on the PCB, and the thermal management apparatus can be secured to the stiffener 160 like described with respect to FIG. 1.

A heat exchanger and fluid pump and/or compressor (HEFP/C) 180 is attached to a top side of the main portion 140 of the thermal management apparatus. The HEFP/C 180 can be attached to the main portion 140 by a TIM and/or by screws. The HEFP/C 180 can receive thermal energy from the main portion 140, transfer that thermal energy to a fluid, and circulate the fluid from an outlet 182, through another heat exchanger, and back to an inlet 184. The HEFP/C 180 can also include a fluid compressor that compresses, e.g., a vapor received at the inlet 184 to a liquid. The flow of the fluid through in the HEFP/C 180 and other heat exchanger can be in a single phase (e.g., a liquid) or in two phases (e.g., liquid, vapor, or a mix thereof). In two phases, the thermal management apparatus may permit refrigerant functionality to cool the first component 102 and second component 106. In some examples, the HEFP/C 180 can provide for self-filtration to clean the fluid flowing through the HEFP/C 180. For example, the HEFP/C 180 can include an internal volume through which the fluid flows. The internal volume can be sufficiently large to permit the fluid to pool therein. With the fluid pooling in the internal volume of the HEFP/C 180, the flow of the fluid may be sufficiently low to permit any particulates in the fluid to settle out of the fluid, which can provide self-filtration.

The thermal management apparatus permits forming different thermal energy flow paths with different thermal resistances. A first thermal energy flow path can be between the first component 102 and the HEFP/C 180 and can be through the second TIM 156, the integral island portion 146, and the main portion 140. As is apparent, there is no change of material or interface between the integral island portion 146 and the main portion 140. A second thermal energy flow path can be between the second component 106 and the HEFP/C 180 and can be through the third TIM 158, the separate island 148, the first TIM 150, and the main portion 140. The first TIM 150 is disposed between the separate island 148 and the main portion 140 in this thermal energy flow path. The combination of materials used for the main portion 140 (and hence, the integral island portion 146, also), the TIMs 150, 156, 158, and the separate island 148 can be selected such that the thermal energy flow paths have different thermal resistances. For example, assuming that the second TIM 156 and third TIM 158 are a same material and that the main portion 140 and the separate island 148 are a same material, the first TIM 150 can be a high thermal resistivity TIM. This can permit the second thermal energy flow path to have a higher thermal resistivity than the first thermal energy flow path. In this example, the first TIM 150 can act as a thermal brake.

In operation, the first component 102 and the second component 106 both generate thermal energy, e.g., due to the consumption of electrical energy, which can be, in part, converted to thermal energy. Thermal energy generated by the first component 102 can flow in the first thermal energy flow path to the HEFP/C 180, which can then transfer the thermal energy for dissipation. Thermal energy generated by the second component 106 can flow in the second thermal energy flow path to the HEFP/C 180, which can then transfer the thermal energy for dissipation. Since the first thermal energy flow path has a lower thermal resistivity than the second thermal energy flow path, the first component 102 can dissipate thermal energy at a greater rate than the second component 106, and the second component 106 can be maintained at a higher operating temperature than the first component 102. This can permit both the first component 102 and the second component 106 to operate within more desirable, yet different, temperature ranges.

Figure 2:
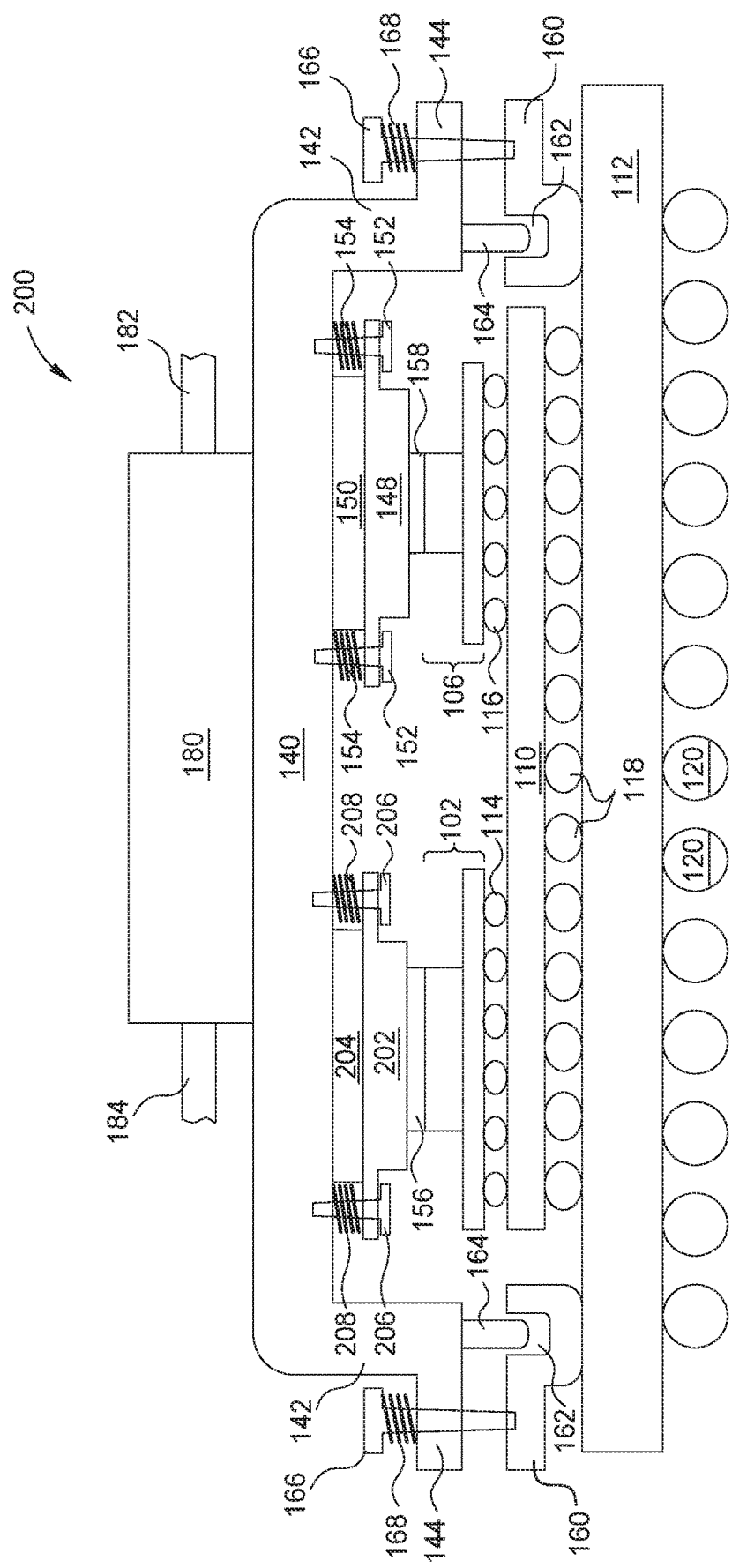
FIG. 2 depicts a simplified cross-sectional view of a second HIM comprising a thermal management apparatus according to some examples.

FIG. 2 illustrates a simplified cross-sectional view of a second HIM 200 comprising a thermal management apparatus according to some examples. The second HIM 200 of FIG. 2 includes many of the same or similar components illustrated in and described with respect to the first HIM 100 of FIG. 1. Accordingly, further description of such components is omitted here for brevity.

In the second HIM 200, a separate island 202 and fourth TIM 204 are in the place of the integral island portion 146 in the first HIM 100. The separate island 202 is mechanically coupled to the bottom side of the main portion 140 and at a location corresponding to the first component 102. The fourth TIM 204 is disposed between and contacting the main portion 140 and the separate island 202. Screws 206 are inserted through the separate island 202 at respective periphery locations, are inserted through respective springs 208, and are threadedly engaged with (e.g., screwed into) the bottom side of the main portion 140. The separate island 202 may float along the length of the screws 206. The springs 208 apply a downward force on the separate island 202 (e.g., in a direction away from the bottom side of the main portion 140). A counter force may be applied to the separate island 202 (e.g., in part by the first component 102). Depending on the magnitude of these forces, the separate island 202 may be at any of various positions along the lengths of the screws 206. The separate island 202 contacts the second TIM 156, and hence, the thermal management apparatus is in thermal communication with the first component 102.

The thermal management apparatus permits forming different thermal energy flow paths with different thermal resistances. In this example, a first thermal energy flow path can be between the first component 102 and the HEFP/C 180 and can be through the second TIM 156, the separate island 202, the fourth TIM 204, and the main portion 140. The second thermal energy flow path is as described above with respect to FIG. 1. The combination of materials used for the main portion 140, the TIMs 150, 156, 158, 204, and the separate islands 148, 202 can be selected such that the thermal energy flow paths have different thermal resistances. For example, assuming that the second TIM 156 and third TIM 158 are a same material and that the separate islands 148, 202 are a same material, the first TIM 150 can be a high thermal resistivity TIM, and the fourth TIM 204 can be a low thermal resistivity TIM. This can permit the second thermal energy flow path to have a higher thermal resistivity than the first thermal energy flow path. In this example, the first TIM 150 can act as a thermal brake.

In operation, the first component 102 and the second component 106 both generate thermal energy. Thermal energy generated by the first component 102 can flow in the first thermal energy flow path, and thermal energy generated by the second component 106 can flow in the second thermal energy flow path. Since the first thermal energy flow path has a lower thermal resistance than the second thermal energy flow path, the first component 102 can dissipate thermal energy at a greater rate than the second component 106, and the second component 106 can be maintained at a higher operating temperature than the first component 102. This can permit both the first component 102 and the second component 106 to operate within more desirable, yet different, temperature ranges.

Figure 3:
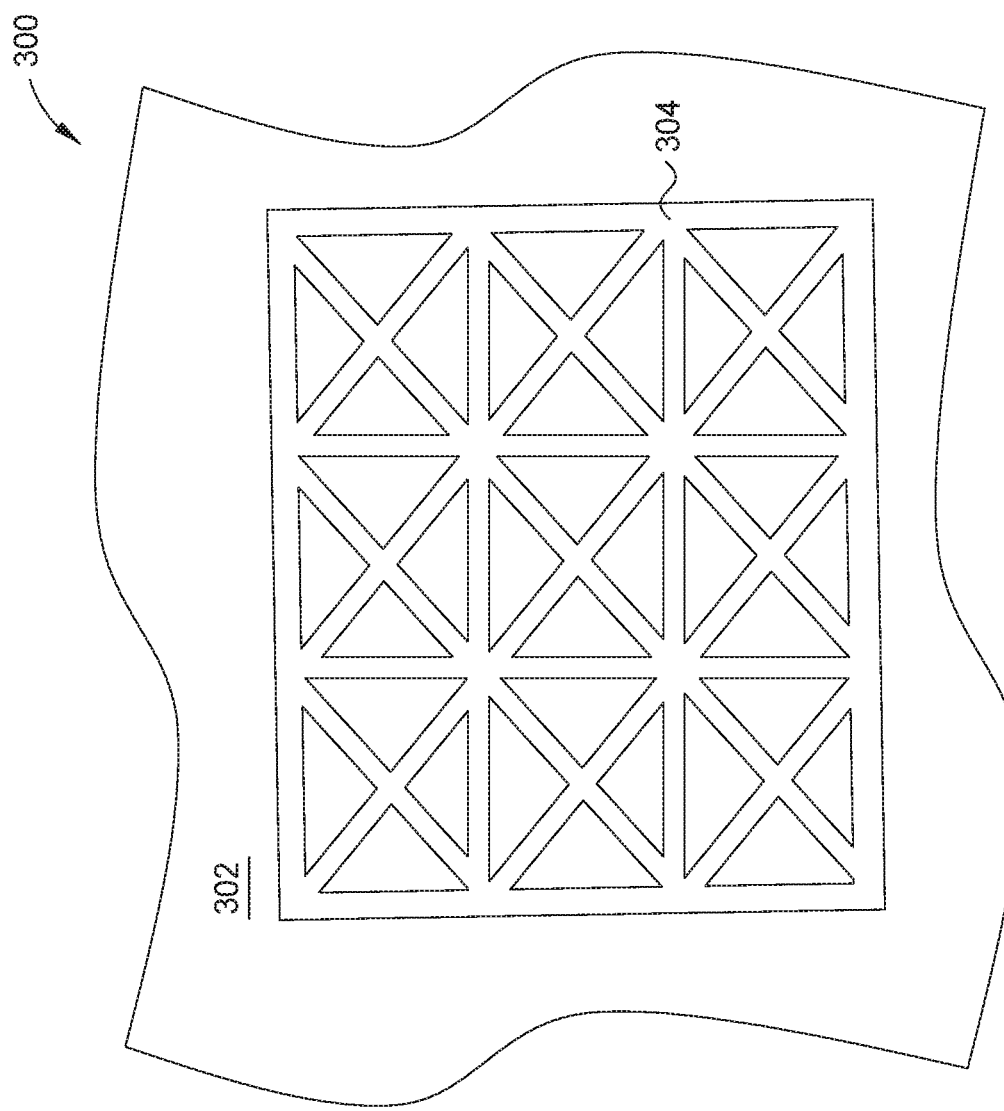
FIG. 3 depicts a channel pattern of a contact region according to some examples.

FIG. 3 illustrates a channel pattern of a contact region 300 according to some examples. The contact region 300 is on an island surface 302. The island surface 302 can be any of the surfaces of the integral island portion 146, the separate island 148, and the separate island 202 where respective TIMs 156, 158 contact those surfaces. The contact region 300 has channels 304 micro-machined or etched into the island surface 302. When the thermal management apparatus of FIG. 1 or 2 is used with a HIM, air in a TIM can settle in the channels 304 in the contact region 300, which can permit the respective integral island portion 146, separate island 148, or separate island 202 to be closer to a component on which the TIM is disposed. The closer the integral island portion 146, separate island 148, or separate island 202 is to the component, the less thermal resistance may be present between the thermal management apparatus and the component, which can permit increased conductivity of thermal energy from the component to the thermal management apparatus for dissipation. The contact region 300, in which the channels are formed, may protrude from a main portion of the island surface 302 in some examples.

The channels 304 cross at a number of intersections. A first subset of channels 304 extend in a first direction (e.g., vertically in the illustration), and a second subset of channels 304 extend perpendicularly (e.g., horizontally in the illustration) to the first direction and intersect the first subset of channels 304 at a number of locations. A third subset of channels 304 extend in a direction at a forty-five degree angle from the first direction, and a fourth subset of channels 304 extend in a direction at a one hundred thirty-five degree angle from the first direction and perpendicularly to the direction that the third subset of channels 304 extend. The fourth subset of channels 304 intersect the third subset of channels 304 where the first subset and second subset of channels 304 intersect and at centers in the quadrilateral shapes formed by the first and second subset of channels 304. Neighboring, parallel pairs of the first and second subset of channels 304 have a first pitch, and neighboring, parallel pairs of the third and fourth subset of channels 304 have a second pitch that is approximately half of the first pitch.

Figure 4:
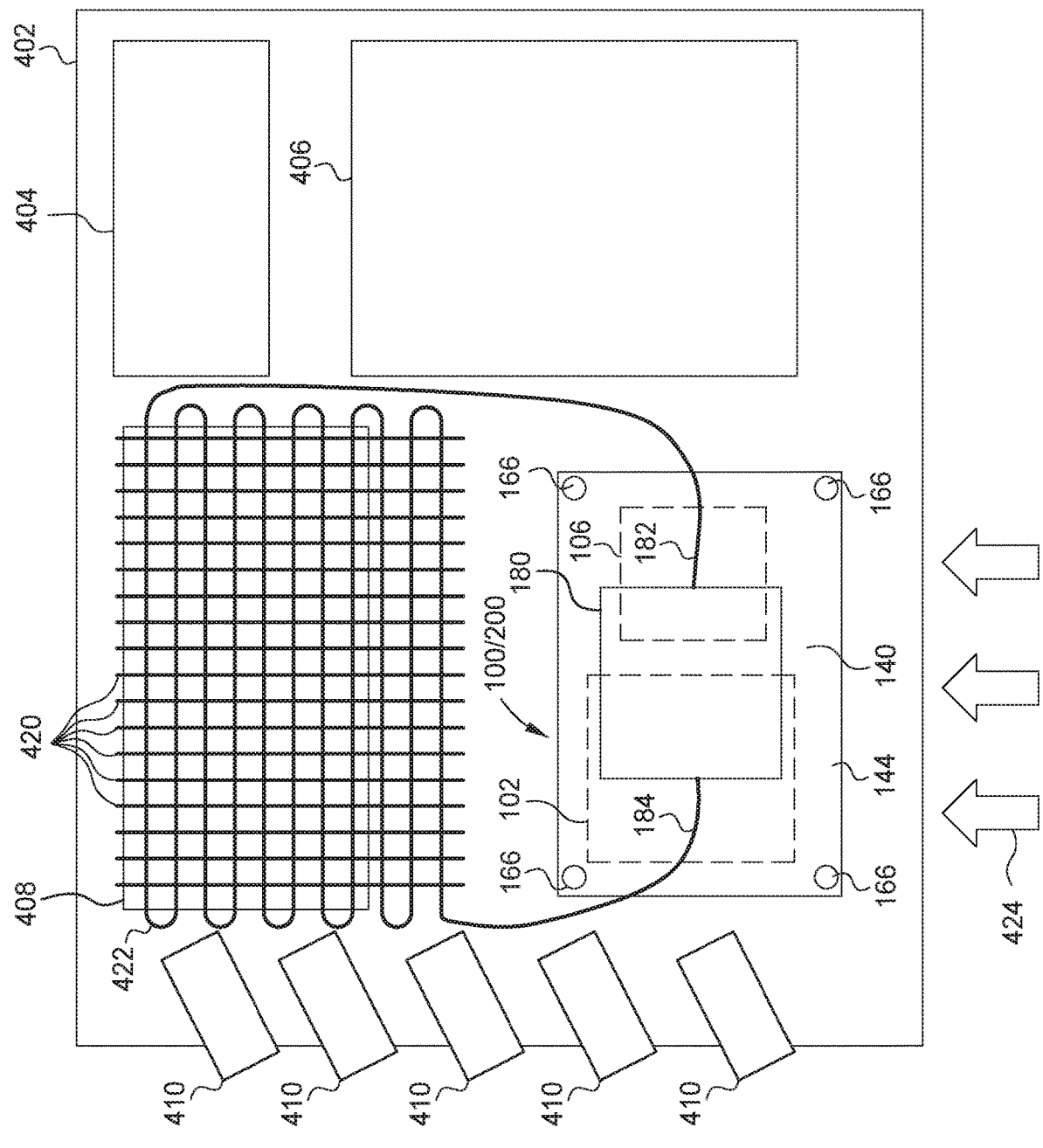
FIG. 4 depicts a layout view of a system comprising the first or second HIM according to some examples.

FIG. 4 illustrates a layout view of a system comprising the first HIM 100 or second HIM 200 (designated "100/200") according to some examples. The system includes a PCB 402. A power supply 404, a first load package 406, and a second load package 408 are disposed on and attached to the PCB 402. A number of optical ports 410 are disposed on and attached to the PCB 402. The HIM 100/200 is disposed on and attached to the PCB 402 (e.g., via the external connectors 120 (not illustrated)). Various components of the HIM 100/200 are depicted in the layout view but not described here, except to note that the first component 102 and second component 106 are shown by dashed lines due to those components underlying the main portion 140 of the thermal management apparatus.

A heat exchanger is disposed on the second load package 408 and is fluidly coupled to the HEFP/C 180. The heat exchanger includes fins 420 and a serpentine pipe 422. The serpentine pipe 422 intersects each of the fins 420 at a number of different locations and is mechanically attached to each of the fins 420 at those locations. The serpentine pipe 422 is further fluidly coupled to the outlet 182 and the inlet 184 of the HEFP/C 180.

In operation, thermal energy received at the HEFP/C 180 from the first component 102 and/or second component 106 is transferred to a fluid (e.g., water that is in a liquid and/or vapor phase) in the HEFP/C 180. The HEFP/C 180 then pumps the fluid out the outlet 182 through the serpentine pipe 422. The thermal energy carried by the fluid can be transferred to the serpentine pipe 422 and then to the fins 420 by thermal conduction. The fluid flowing through the serpentine pipe 422 can be in a liquid phase, a vapor phase, or a mixture of liquid and vapor phases. The thermal energy can be dissipated from the serpentine pipe 422 and fins 420 by gas (e.g. air) flow 424. The fluid, e.g., with the thermal energy dissipated, is circulated through the serpentine pipe 422 to the inlet 184 of the HEFP/C 180. The HEFP/C 180 can also compress the fluid (e.g., from a vapor phase to a liquid phase) received at the inlet 184, which may provide refrigerant functionality. The HEFP/C 180 can continuously recirculate the fluid, such as at a rate of about 1.1 L/min and at a pressure of about 4 PSI. In this example, the heat exchanger comprising the serpentine pipe 422 and fins 420 can act as a primary heat sink to thermally manage active devices on the PCB 402.

In some examples, the system of FIG. 4 has a form factor of a height of 15 inches, a width of 17 inches, and a thickness of 1.7 inches. It is contemplated that in some of these examples, the system is capable of dissipating 1 kW of thermal energy. For example, the power supply 404 can generate approximately 100 W to 150 W; the first load package 406 and second load package 408 can each generate approximately 200 W; the PCB 402 can generate approximately 50 W; the first component 102 can generate approximately 40 W; and the second component 106 can generate approximately 205 W. This thermal energy can be dissipated by the system.

Figure 5:
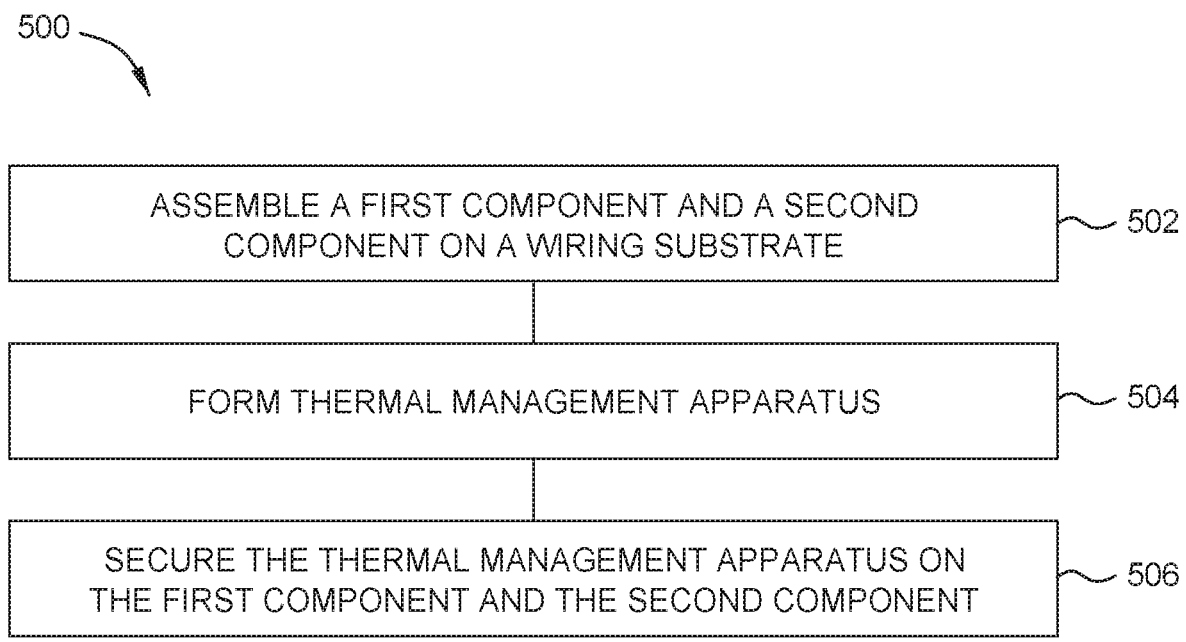
FIG. 5 is flow diagram of a method for forming a HIM according to some examples.

FIG. 5 is flow diagram of a method 500 for forming a HIM according to some examples. Various operations of the method 500 can be performed sequentially or in parallel. At block 502, a first component 102 and a second component 106 are assembled on a wiring substrate to be electrically and communicatively coupled together. The first component 102 and second component 106 can be assembled on a wiring substrate by any acceptable technique, which would be readily apparent to a person having ordinary skill in the art. In the foregoing illustrated examples, the first component 102 and the second component 106 are attached to the interposer 110, such as by reflowing the external connectors 114, 116. The interposer 110 is attached to the package substrate 112, such as by reflowing the external connectors 118.

At block 504, a thermal management apparatus is formed. The main portion 140, vertical support portion 142, guide pins 164, and, if applicable, integral island portion 146 of the thermal management apparatus can be machined from any heat conducting material, such as a metal material, like cooper, aluminum, aluminum titanium, or the like. Similarly, the separate island 148 and, if applicable, separate island 202 of the thermal management apparatus can be machined from any heat conducting material, such as a metal material, like cooper, aluminum, aluminum titanium, or the like. The material of the main portion 140 and the respective materials of the separate islands 148, 202 can be the same or different. The first TIM 150 can be applied to the separate island 148, and then, the separate island 148 can be secured to the bottom of the main portion 140 using the screws 152 and springs 154. If applicable, the fourth TIM 204 can be applied to the separate island 202, and then, the separate island 202 can be secured to the bottom of the main portion 140 using the screws 206 and springs 208. The first TIM 150 and the fourth TIM 204 can each be, for example, a thermal grease that includes a liquid matrix and a thermally conductive filler. When both the first TIM 150 and fourth TIM 204 are implemented, the first TIM 150 can have a lower ratio of filler to matrix and/or a filler with lower thermal conductivity than the fourth TIM 204.

At block 506, the thermal management apparatus is secured on the first component 102 and the second component 106. The thermal management apparatus is secured to be in thermal communication with the first component 102 and the second component 106. Depending on how the first component 102 and the second component 106 were assembled, the thermal management apparatus can be secured on the first component 102 and the second component 106 by mechanically coupling the thermal management apparatus to, for example, a package substrate or a PCB. In the foregoing examples, the thermal management apparatus is mechanically coupled to the package substrate 112. According to the foregoing examples, a stiffener 160 having blind holes 162 (corresponding to the guide pins 164) can be manufactured, such as by machining a rigid material, such as a metal. The stiffener 160 can be attached to the package substrate 112 by an adhesive. In some examples where the stiffener 160 is attached to a PCB, the stiffener 160 can be attached by an adhesive or by soldering the stiffener 160 to a metal on the surface of the PCB. The second TIM 156 and third TIM 158 are applied to the first component 102 and the second component 106, respectively. The second TIM 156 and third TIM 158 can each be, for example, a thermal grease that includes a liquid matrix and a thermally conductive filler. The second TIM 156 and third TIM 158 can have a same material composition, or the third TIM 158 can have a lower ratio of filler to matrix and/or a filler with lower thermal conductivity than the second TIM 156. The thermal management apparatus can then be placed on the first component 102 and the second component 106 and can be attached to the stiffener 160 in that position by guide pins 164 being inserted in the blind holes 162 and by the screws 166 and springs 168.

Thereafter, the HIM, if not assembled on a PCB, can be attached to a PCB, such as illustrated in and described with respect to FIG. 4. A HEFP/C 180 can be attached to the thermal management apparatus, such as by a TIM and/or by screws, and can be fluidly coupled to a heat exchanger, such as comprising a serpentine pipe 422 and fins 420 as illustrated in and described with respect to FIG. 4. The HIM, in the system included on the PCB, can be operated as described above.

While the foregoing is directed to specific examples, other and further examples may be devised without departing from the basic scope thereof, and the scope thereof is determined by the claims that follow.

What is claimed is:

1. An apparatus comprising:
   a wiring substrate;
   a first component;
   a second component, the first component and the second component being communicatively coupled together via the wiring substrate;
   a stiffener configured to be mechanically attached to a package substrate; and
   a thermal management apparatus in thermal communication with the first component and the second component, the thermal management apparatus comprises:
      a monolithic main portion overlying the first component and the second component;
      a first separate island attached to the main portion, and contacting a first thermal interface material disposed on the second component, the first separate island being spring-biased against the main portion, wherein the thermal management apparatus has a first thermal energy flow path for dissipating thermal energy generated by the first component and a second thermal energy flow path for dissipating thermal energy generated by the second component, the first thermal energy flow path having a lower thermal resistivity than the second thermal energy flow path; and
a flange portion extending perpendicularly from a support portion of the thermal management apparatus and away from the main portion, the flange portion coupled to the stiffener via a first fastener capturing a first spring and a second fastener capturing a second spring, wherein the stiffener is configured to apply a downward force between the first separate island and the second component.

2. The apparatus of claim 1, wherein the first component is an optical device, photonic device, or a combination thereof, and the second component is an electrical device.

3. The apparatus of claim 1, wherein:
a second thermal interface material is disposed on the first component; and
the thermal management apparatus is disposed on and contacting the second thermal interface material, and wherein:
the thermal management apparatus further comprises:
an integral island portion integrally formed with the main portion; and
a third thermal interface material disposed between the first separate island and the main portion;
the integral island portion contacts the second thermal interface material;
the first thermal energy flow path is through the integral island portion and the main portion; and
the second thermal energy flow path is through the first separate island, the third thermal interface material, and the main portion.

4. The apparatus of claim 1, wherein:
a second thermal interface material is disposed on the first component; and
the thermal management apparatus is disposed on and contacting the second thermal interface material, and wherein:
the thermal management apparatus further comprises:
a second separate island attached to the main portion, the second separate island being spring-biased against the main portion;
a third thermal interface material disposed between the second separate island and the main portion; and
a fourth thermal interface material disposed between the first separate island and the main portion;
the second separate island contacts the second thermal interface material;
the first thermal energy flow path is through the second separate island, the third thermal interface material, and the main portion; and
the second thermal energy flow path is through the first separate island, the fourth thermal interface material, and the main portion.

5. The apparatus of claim 1 further comprising a heat exchanger attached to the thermal management apparatus, the heat exchanger including a fluid pump, a compressor, or a combination thereof.

6. The apparatus of claim 1 further comprising:
the package substrate wherein the stiffener is mechanically attached to the package substrate, and wherein:
the wiring substrate is an interposer;
the first component and the second component are each attached to the interposer;
the interposer is attached to the package substrate;
the stiffener is laterally around the interposer; and
the support portion extends perpendicularly from the main portion, and the flange portion extends away from the main portion;
the main portion is in thermal communication with the first component and the second component.

7. A system comprising:
a heterogeneous integration module comprising:
a wiring substrate;
a stiffener configured to be mechanically attached to a package substrate
a first component attached to the wiring substrate;
a second component attached to the wiring substrate, the first component and the second component being communicatively coupled together through the wiring substrate;
a first thermal interface material disposed on the first component;
a second thermal interface material disposed on the second component; and
a thermal management apparatus contacting the first thermal interface material and the second thermal interface material, the thermal management apparatus comprises:
a monolithic main portion overlying the first component and the second component;
a first separate island attached to the main portion, and contacting the second thermal interface material, the first separate island being spring-biased against the main portion, wherein the thermal management apparatus has a first thermal energy flow path from where the thermal management apparatus contacts the first thermal interface material and having a second thermal energy flow path from where the thermal management apparatus contacts the second thermal interface material, the first thermal energy flow path having a lower thermal resistivity than the second thermal energy flow path; and
a flange portion extending perpendicularly from a support portion of the thermal management apparatus and away from the main portion, the flange portion coupled to the stiffener via a first fastener capturing a first spring and a second fastener capturing a second spring, wherein the stiffener is configured to apply a downward force between the first separate island and the second component.

8. The system of claim 7, wherein the first component is an optical device, a photonic device, or a combination thereof, and the second component is an electrical device.

9. The system of claim 7, wherein:
the thermal management apparatus further comprises:
an integral island portion integrally formed with the main portion; and
a third thermal interface material disposed between the first separate island and the main portion;
the integral island portion contacts the first thermal interface material;
the first thermal energy flow path is through the integral island portion and the main portion; and
the second thermal energy flow path is through the first separate island, the third thermal interface material, and the main portion.

10. The system of claim 7, wherein:
the thermal management apparatus further comprises:
   a second separate island attached to the main portion, the second separate island being spring-biased against the main portion;
   a third thermal interface material disposed between the second separate island and the main portion; and
   a fourth thermal interface material disposed between the first separate island and the main portion;
the second separate island contacts the first thermal interface material;
the first thermal energy flow path is through the second separate island, the third thermal interface material, and the main portion;
the first separate island contacts the second thermal interface material; and
the second thermal energy flow path is through the first separate island, the fourth thermal interface material, and the main portion.

11. The system of claim 7 further comprising a printed circuit board, the heterogeneous integration module being attached to the printed circuit board.

12. The system of claim 11 further comprising:
a first heat exchanger attached to the thermal management apparatus, the first heat exchanger comprising a fluid pump, a compressor, or a combination thereof; and
a second heat exchanger disposed on the printed circuit board, the second heat exchanger comprising a serpentine pipe and fins, the serpentine pipe being attached to and extending through the fins, the serpentine pipe being fluidly coupled with the first heat exchanger.

13. The system of claim 12, wherein the first heat exchanger includes an internal volume through which fluid is to flow, the internal volume permitting pooling of the fluid in operation.

14. The system of claim 7, wherein the heterogeneous integration module further comprises:
the package substrate, wherein the stiffener is mechanically attached to the package substrate, and
wherein:
   the wiring substrate is an interposer;
   the first component and the second component are each attached to the interposer;
   the interposer is attached to the package substrate;
   the stiffener is laterally around the interposer; and
   the support portion extends perpendicularly from the main portion, and the flange portion extends away from the main portion;
   the main portion is in thermal communication with the first component and the second component.

15. A method for forming a heterogeneous integration module, the method comprising:
assembling a first component and a second component on a wiring substrate; and
securing a thermal management apparatus in thermal communication with the first component and the second component, the thermal management apparatus comprising:
   a monolithic main portion overlying the first component and the second component;
   a first separate island attached to the main portion, and contacting a first thermal interface material disposed on the second component, the first separate island being spring-biased against the main portion, the thermal management apparatus having a first thermal energy flow path for thermal energy generated by the first component and having a second thermal energy flow path for thermal energy generated by the second component, the first thermal energy flow path having a lower thermal resistivity than the second thermal energy flow path; and
   a flange portion extending perpendicularly from a support portion of the thermal management apparatus and away from the main portion, the flange portion coupled to a stiffener via a first fastener capturing a first spring and a second fastener capturing a second spring, wherein the stiffener is configured to be attached to a package substrate and apply a downward force between the first separate island and the second component.

16. The method of claim 15, wherein the first component is an optical device, a photonic device, or a combination thereof, and the second component is an electrical device.

17. The method of claim 15, wherein:
the thermal management apparatus further comprises:
   an integral island portion integrally formed with the main portion; and
   the first thermal energy flow path is through the integral island portion and the main portion; and
the second thermal energy flow path is through the first separate island, the first thermal interface material, and the main portion.

18. The method of claim 15, wherein:
the thermal management apparatus further comprises:
   a second separate island attached to the main portion, the second separate island being spring-biased against the main portion;
   a second thermal interface material disposed between the second separate island and the main portion; and
   a third thermal interface material disposed between the second separate island and the main portion;
the first thermal energy flow path is through the second separate island, the second thermal interface material, and the main portion; and
the second thermal energy flow path is through the first separate island, the third thermal interface material, and the main portion.

19. The method of claim 15, wherein:
assembling the first component and the second component on the wiring substrate comprises:
   attaching the first component and the second component to an interposer, the interposer being the wiring substrate; and
   attaching the interposer to the package substrate; and
securing the thermal management apparatus comprises:
   attaching the stiffener to the package substrate; and
   attaching the thermal management apparatus to the stiffener.

20. The apparatus of claim 1 further comprising:
the package substrate, wherein the stiffener is mechanically attached to the package substrate, and wherein:
the wiring substrate is attached to the package substrate,
the first separate island is attached to the main portion along a periphery of the first separate island via a third fastener and a fourth fastener,
the first separate island being spring-biased against the main portion via a first spring captured by the third fastener and a second spring captured by the fourth fastener, and
the third fastener, the fourth fastener, the first spring, and the second spring are disposed outside a periphery of the second component.

* * * * *